(12) United States Patent
Den Boef et al.

(10) Patent No.: US 9,958,774 B2
(45) Date of Patent: *May 1, 2018

(54) IMPRINT LITHOGRAPHY

(71) Applicant: ASML NETHERLANDS B.V., Veldhoven (NL)

(72) Inventors: Arie Jeffrey Den Boef, Waalre (NL); Andre Bernardus Jeunink, Bergeijk (NL); Sander Frederik Wuister, Eindhoven (NL); Yvonne Wendela Kruijt-Stegeman, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/258,903

(22) Filed: Sep. 7, 2016

(65) Prior Publication Data

US 2016/0377997 A1 Dec. 29, 2016

Related U.S. Application Data

(63) Continuation of application No. 13/579,544, filed as application No. PCT/EP2011/050246 on Jan. 11, 2011, now Pat. No. 9,535,322.

(60) Provisional application No. 61/310,077, filed on Mar. 3, 2010.

(51) Int. Cl.
*G03F 9/00* (2006.01)
*G03F 7/00* (2006.01)
*B82Y 10/00* (2011.01)
*B82Y 40/00* (2011.01)

(52) U.S. Cl.
CPC ............ *G03F 7/0002* (2013.01); *B82Y 10/00* (2013.01); *B82Y 40/00* (2013.01); *G03F 9/7042* (2013.01)

(58) Field of Classification Search
CPC .......... B82Y 40/00; G03F 9/00; G03F 9/7076
USPC ......... 264/293, 412, 406; 425/150, 385, 470
See application file for complete search history.

(56) References Cited

U.S. PATENT DOCUMENTS

| 4,340,305 A | 7/1982 | Smith et al. |
| 4,631,416 A | 12/1986 | Trutna, Jr. |
| 4,656,347 A | 4/1987 | Une et al. |
| 4,668,089 A | 5/1987 | Oshida et al. |
| 4,731,155 A | 3/1988 | Napoli et al. |
| 5,162,656 A | 11/1992 | Matsugu et al. |

(Continued)

FOREIGN PATENT DOCUMENTS

| WO | 02/067055 | 8/2002 |
| WO | 2006/024908 | 3/2006 |

OTHER PUBLICATIONS

International Search Report dated Oct. 21, 2011 in corresponding International Patent Application No. PCT/EP2011/050246.

(Continued)

*Primary Examiner* — Nahida Sultana
(74) *Attorney, Agent, or Firm* — Pillsbury Winthrop Shaw Pittman LLP (57) ABSTRACT

A method of determining a position of an imprint template in an imprint lithography apparatus is disclosed. In an embodiment, the method includes illuminating an area of the imprint template in which an alignment mark is expected to be found by scanning an alignment radiation beam over that area, detecting an intensity of radiation reflected or transmitted from the area, and identifying the alignment mark via analysis of the detected intensity.

20 Claims, 6 Drawing Sheets

(56) References Cited

U.S. PATENT DOCUMENTS

| | | | |
|---|---|---|---|
| 5,414,514 A | 5/1995 | Smith et al. | |
| 5,772,905 A | 6/1998 | Chou | |
| 6,334,960 B1 | 1/2002 | Willson et al. | |
| 6,628,406 B1 | 9/2003 | Kreuzer | |
| 6,814,897 B2 | 11/2004 | Morita | |
| 6,940,681 B2 | 9/2005 | Bellesis et al. | |
| 6,992,767 B2 | 1/2006 | Matsumoto | |
| 7,418,902 B2 | 9/2008 | Kruijt-Stegeman et al. | |
| 7,790,092 B2 | 9/2010 | Jones et al. | |
| 7,888,638 B2 | 2/2011 | Miyamoto et al. | |
| 7,927,090 B2 | 4/2011 | Ten Berge | |
| 8,011,915 B2 | 9/2011 | Simon | |
| 8,319,968 B2 | 11/2012 | Den Boef et al. | |
| 8,432,548 B2 | 4/2013 | Choi | |
| 8,496,462 B2 | 7/2013 | Kimura | |
| 8,525,994 B2 | 9/2013 | Abdulhalim et al. | |
| 8,691,124 B2 | 4/2014 | Wuister et al. | |
| 2001/0003384 A1 | 6/2001 | Morita | |
| 2001/0007682 A1 | 7/2001 | Chiu et al. | |
| 2001/0046315 A1 | 11/2001 | Sentoku | |
| 2004/0124566 A1 | 7/2004 | Sreenivasan et al. | |
| 2005/0274693 A1 | 12/2005 | Heidari et al. | |
| 2006/0032437 A1 | 2/2006 | McMackin et al. | |
| 2006/0092419 A1 | 5/2006 | Gui | |
| 2006/0126058 A1 | 6/2006 | Nimmakayala | |
| 2006/0139642 A1 | 6/2006 | Van Bilsen | |
| 2006/0158651 A1 | 7/2006 | Watts et al. | |
| 2006/0267231 A1* | 11/2006 | Van Santen | B29C 43/003 264/40.1 |
| 2007/0013921 A1 | 1/2007 | Pellemans et al. | |
| 2007/0176320 A1 | 8/2007 | Nakamura et al. | |
| 2007/0222979 A1 | 9/2007 | Van Der Laan et al. | |
| 2007/0252963 A1 | 11/2007 | Modderman et al. | |
| 2007/0257389 A1 | 11/2007 | Ruf | |
| 2008/0073604 A1 | 3/2008 | Suehira et al. | |
| 2008/0088843 A1 | 4/2008 | Shibazaki | |
| 2008/0137049 A1 | 6/2008 | Jasper et al. | |
| 2008/0165368 A1 | 7/2008 | Matsumoto | |
| 2008/0185506 A1* | 8/2008 | Makinouchi | G01D 5/38 250/231.13 |
| 2009/0026657 A1 | 1/2009 | Nimmakayala et al. | |
| 2009/0108483 A1 | 4/2009 | Suehira | |
| 2009/0115987 A1 | 5/2009 | Butler et al. | |
| 2009/0250840 A1* | 10/2009 | Selinidis | B82Y 10/00 264/293 |
| 2010/0081010 A1 | 4/2010 | Tatsugawa et al. | |
| 2010/0173033 A1 | 7/2010 | Bailey et al. | |
| 2010/0195102 A1 | 8/2010 | Den Boef | |
| 2011/0018168 A1* | 1/2011 | Wuister | B82Y 10/00 264/293 |
| 2011/0076352 A1* | 3/2011 | Den Boef | B82Y 10/00 425/385 |
| 2011/0221095 A1* | 9/2011 | Sreenivasan | B81C 1/0046 264/293 |
| 2011/0266706 A1* | 11/2011 | Dijksman | G03F 7/0002 264/40.1 |
| 2011/0278768 A1 | 11/2011 | Sato | |
| 2012/0225152 A1 | 9/2012 | Wuister et al. | |
| 2012/0286443 A1* | 11/2012 | Sato | G01B 11/27 264/40.5 |
| 2012/0313295 A1* | 12/2012 | Den Boef | B82Y 10/00 264/406 |
| 2013/0015598 A1* | 1/2013 | Kimura | G03F 7/0002 264/40.1 |
| 2013/0015599 A1* | 1/2013 | Kawahara | G03F 7/0002 264/40.5 |
| 2013/0193602 A1* | 8/2013 | Suzuki | B29C 59/002 264/40.1 |
| 2013/0292879 A1* | 11/2013 | Disawal | B29C 45/372 264/328.2 |
| 2013/0328725 A1* | 12/2013 | Wuoti | G01S 3/02 342/451 |
| 2014/0055768 A1 | 2/2014 | Sasaki | |
| 2015/0116690 A1 | 4/2015 | Wang | |
| 2015/0235880 A1* | 8/2015 | Inada | H01L 21/304 438/16 |
| 2016/0297117 A1* | 10/2016 | Sato | G02B 27/141 |
| 2017/0023857 A1* | 1/2017 | Sato | G03F 7/0002 |
| 2017/0073511 A1* | 3/2017 | Peterson | C08L 23/12 |

OTHER PUBLICATIONS

Jan Haisma et al., "Mold-assisted nanolithography: A process for reliable pattern replication," J. Vac. Sci. Technol. B, vol. 14, No. 6, pp. 4124-4128 (Nov./Dec. 1996).

International Preliminary Report on Patentability and Written Opinion dated Sep. 13, 2012 in corresponding International Patent Application No. PCT/EP2011/050246.

\* cited by examiner

IMPRINT LITHOGRAPHY

This application is a continuation of U.S. patent application Ser. No. 13/579,544, filed on Aug. 16, 2012, which is the United States national phase entry of PCT patent application no. PCT/EP2011/050246, filed Jan. 11, 2011, which claims the benefit under 35 USC §119(e) of U.S. provisional patent application No. 61/310,077, filed on Mar. 3, 2010, the contents of each of the foregoing documents incorporated herein in its entirety by reference.

FIELD

The present invention relates to imprint lithography.

BACKGROUND

In lithography, there is an ongoing desire to reduce the size of features in a lithographic pattern in order to increase the density of features on a given substrate area. In photolithography, the push for smaller features has resulted in the development of technologies such as immersion lithography and extreme ultraviolet (EUV) lithography, which are however rather costly.

A potentially less costly road to smaller features (e.g. micron size or nanometer sized features, e.g., less than or equal to 10 microns, less than or equal to 1 micron, less than or equal to 50 nm, less than or equal 25 nm or less than or equal to 10 nm sized features) that has gained increasing interest is so-called imprint lithography, which generally involves the use of a "stamp" (often referred to as an imprint lithography template) to transfer a pattern onto a substrate. An advantage of imprint lithography is that the resolution of the features is not limited by, for example, the emission wavelength of a radiation source or the numerical aperture of a projection system. Instead, the resolution is mainly limited to the pattern density on the imprint lithography template.

Imprint lithography involves the patterning of an imprintable medium on a surface of a substrate to be patterned. The patterning may involve bringing together a patterned surface of an imprint lithography template and a layer of imprintable medium (e.g., moving the imprint lithography template toward the imprintable medium, or moving the imprintable medium toward the imprint lithography template, or both) such that the imprintable medium flows into recesses in the patterned surface and is pushed aside by protrusions on the patterned surface, to adopt the topography of that patterned surface. The recesses define pattern features of the patterned surface of the imprint template. Typically, the imprintable medium is flowable when the patterned surface and the imprintable medium are brought together. Following patterning of the imprintable medium, the imprintable medium is suitably brought into a non-flowable or frozen state (i.e. a fixed state), for example by illuminating the imprintable medium with actinic radiation. The patterned surface of the imprint lithography template and the patterned imprintable medium are then separated. The substrate and patterned imprintable medium are then typically processed further in order to pattern or further pattern the substrate. The imprintable medium may be provided in the form of droplets on the surface of a substrate to be patterned, but may alternatively be provided using spin coating or the like.

Lithography typically involves applying several patterns onto a substrate, the patterns being stacked on top of one another such that together they form a device such as an integrated circuit. Alignment of each pattern with a previously provided pattern is a significant consideration. If patterns are not aligned with each other sufficiently accurately, then this may result in, for example, electrical connections between layers not being made. This, in turn, may cause the device to be non-functional. A lithographic apparatus therefore usually includes an alignment apparatus which is intended to align each pattern with a previously provided pattern.

SUMMARY

It is desirable to provide an imprint lithography alignment apparatus and method which is novel and inventive over the prior art.

According to an aspect, there is provided a method of determining a position of an imprint template in an imprint lithography apparatus, the method comprising illuminating an area of the imprint template in which an alignment mark is expected to be found by scanning an alignment radiation beam over that area, detecting an intensity of radiation reflected or transmitted from the area, and identifying the alignment mark via analysis of the detected intensity.

According to an aspect, there is provided an imprint lithography apparatus comprising an imprint template holder configured to hold an imprint template, an alignment radiation beam outlet, a detector, and a processor, wherein the apparatus is configured to provide scanning movement between the imprint template and an alignment radiation beam provided by the alignment radiation beam outlet, such that the alignment radiation beam illuminates an area of the imprint template in which an alignment mark is expected to be found, the detector is configured to detect an intensity of radiation reflected or transmitted from the area, and the processor is configured to identify the alignment mark via analysis of the detected intensity.

According to an aspect, there is provided a method of obtaining coarse alignment of a substrate and an imprint template, the method comprising illuminating an imprint template alignment grating using an alignment radiation beam, providing relative movement between the substrate and the imprint template in a first lateral direction, providing a modulation between the substrate and the imprint template in a second lateral direction which includes a component that is perpendicular to the first lateral direction, detecting modulation of the alignment radiation when the relative movement between the substrate and the imprint template in the first lateral direction causes a substrate alignment grating to overlap with the imprint template alignment grating, and analysing the detected modulation to determine a maximum overlap between the substrate alignment grating and the imprint template alignment grating, and to determine the relative positions of the substrate and the imprint template when the maximum overlap occurred.

According to an aspect, there is provided an imprint lithography apparatus comprising an imprint template holder configured to hold an imprint template and a substrate holder configured to hold a substrate, the imprint template holder and/or the substrate holder configured to provide relative movement between the substrate and the imprint template in a first lateral direction, and configured to provide a modulation between the substrate and the imprint template in a second lateral direction which includes a component that is perpendicular to the first lateral direction, an alignment radiation beam outlet configured to illuminate an imprint template alignment grating, a detector configured to detect radiation reflected from the imprint template alignment grating and an adjacent substrate alignment grating, and a processor configured to determine a maximum of a modulation of the detected reflected alignment radiation, and to determine a maximum overlap between the substrate alignment grating and the imprint template alignment grating based on the determined maximum of the modulation, the maximum overlap providing coarse alignment of the substrate and the imprint template.

According to an aspect, there is provided an imprint template alignment grating comprising a low resolution grating formed from sets of lines which comprise high resolution gratings.

According to an aspect, there is provided an imprint template and a substrate, the imprint template having a first imprint template alignment grating and a second imprint template alignment grating, and the substrate having a first substrate alignment grating and a second substrate alignment grating, wherein the pitch of the first imprint template alignment grating is smaller than the pitch of the second imprint template alignment grating, and the pitch of the first substrate alignment grating is smaller than the pitch of the second substrate alignment grating.

BRIEF DESCRIPTION OF THE DRAWINGS

Specific embodiments of the invention will be described with reference to the accompanying Figures, in which:

FIGS. 2 to 5 schematically shows a lithographic apparatus according to an embodiment of the invention;

DETAILED DESCRIPTION

Figure 1:
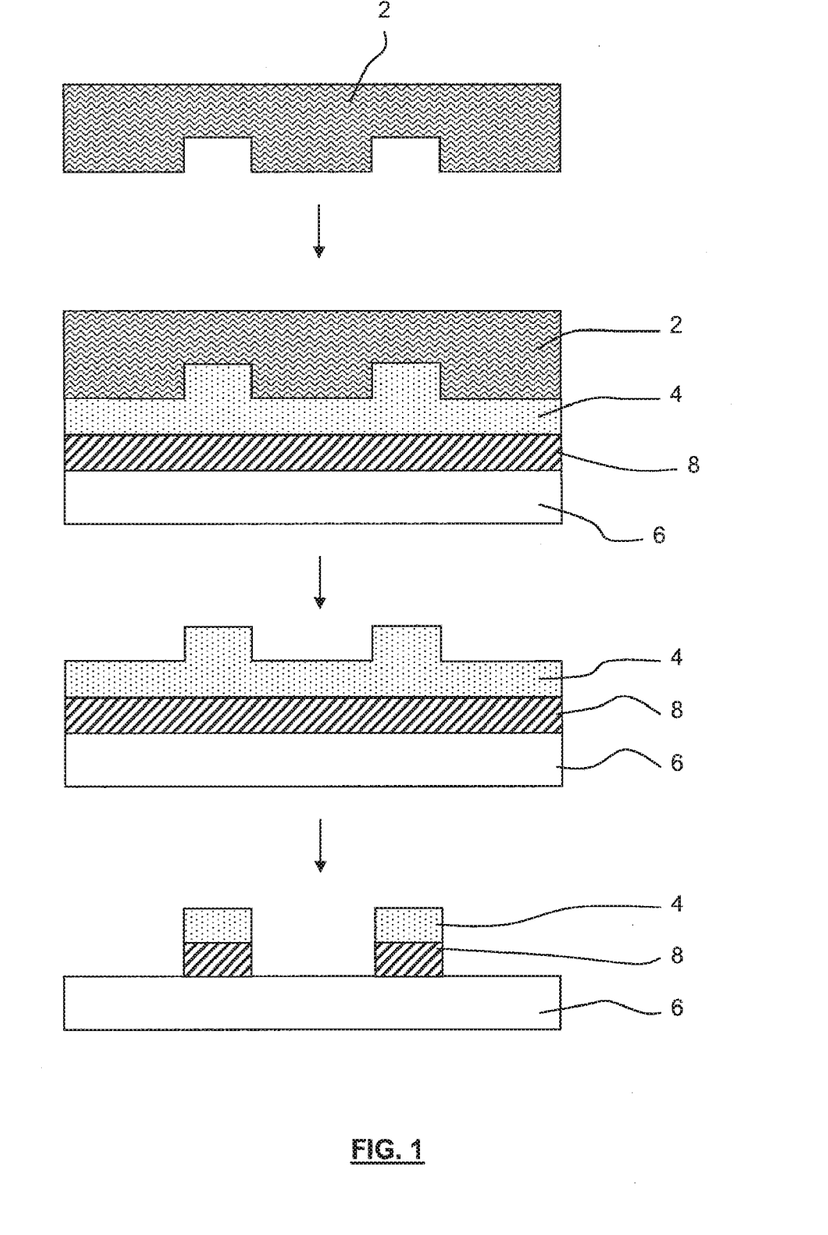
FIGS. 1 and 2 schematically depict examples of, respectively, hot imprint, and UV imprint lithography.
Figure 2:
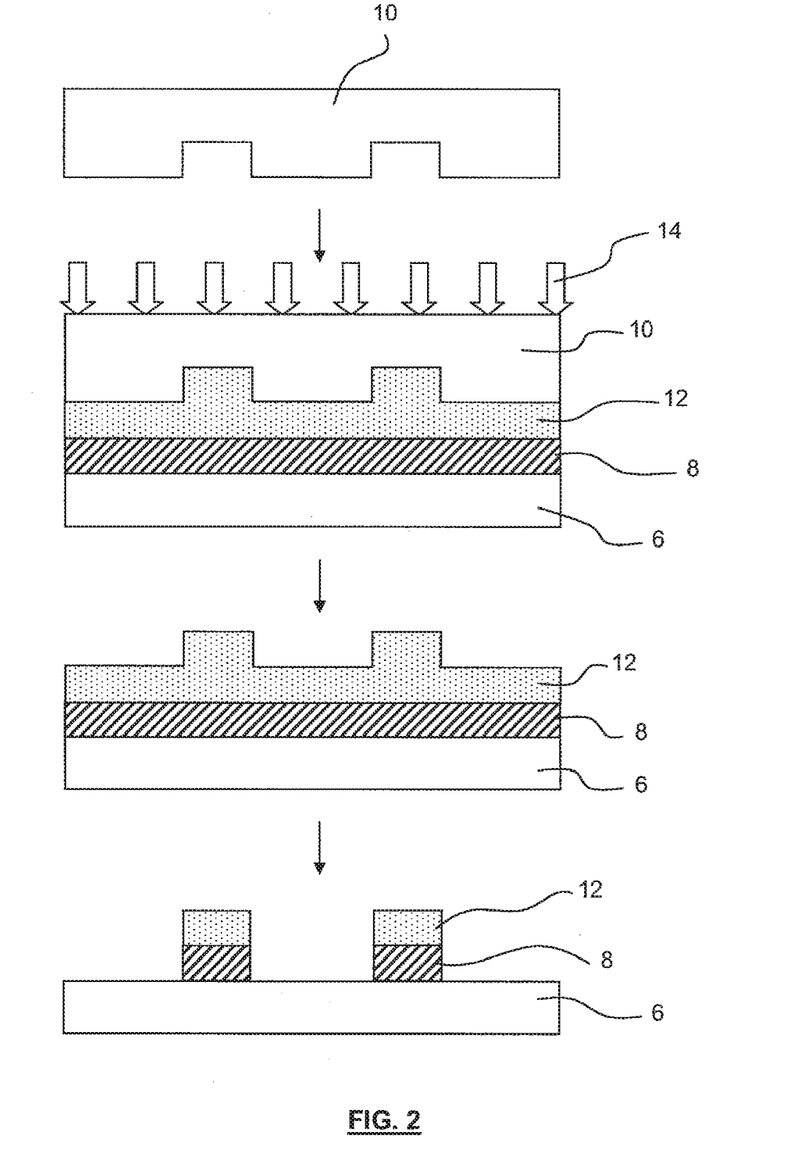

Examples of approaches to imprint lithography are schematically depicted in FIGS. 1 and 2.

FIG. 1 shows an example of so-called hot imprint lithography (or hot embossing). In a typical hot imprint process, a template 2 is imprinted into a thermosetting or a thermoplastic imprintable medium 4, which has been cast on the surface of a substrate 6. The imprintable medium 4 may be, for example, resin. The resin, for instance, may be spin coated and baked onto the substrate surface or, as in the example illustrated, onto a planarization and transfer layer 8 of the substrate 6. When a thermosetting polymer resin is used, the resin is heated to a temperature such that, upon contact with the template, the resin is sufficiently flowable to flow into the pattern features defined on the template. The temperature of the resin is then increased to thermally cure (crosslink) the resin so that it solidifies and irreversibly adopts the desired pattern. The template 2 may then be removed and the patterned resin cooled. In hot imprint lithography employing a layer of thermoplastic polymer resin, the thermoplastic resin is heated so that it is in a freely flowable state immediately prior to imprinting with the template 2. It may be necessary to heat a thermoplastic resin to a temperature considerably above the glass transition temperature of the resin. The template is pressed into the flowable resin and then cooled to below its glass transition temperature with the template 2 in place to harden the pattern. Thereafter, the template 2 is removed. The pattern will consist of the features in relief from a residual layer of the resin which may then be removed by an appropriate etch process to leave only the pattern features. Examples of thermoplastic polymer resins used in hot imprint lithography processes are poly (methyl methacrylate), polystyrene, poly (benzyl methacrylate) or poly (cyclohexyl methacrylate). For more information on hot imprint, see e.g. U.S. Pat. No. 4,731,155 and U.S. Pat. No. 5,772,905.

FIG. 2 shows an example of UV imprint lithography, which involves the use of a transparent or translucent template which is transmissive to UV and a UV-curable liquid as imprintable medium (the term "UV" is used here for convenience but should be interpreted as including any suitable actinic radiation for curing the imprintable medium). A UV curable liquid is often less viscous than a thermosetting or thermoplastic resin used in hot imprint lithography and consequently may move much faster to fill template pattern features. A quartz template 10 is applied to a UV-curable resin 12 in a similar manner to the process of FIG. 1a. However, instead of using heat or temperature cycling as in hot imprint, the pattern is frozen by curing the imprintable medium 12 with UV radiation 14 that is applied through the quartz template 10 onto the imprintable medium 12. After removal of the template 10, the imprintable medium 12 is etched. A particular manner of patterning a substrate through UV imprint lithography is so-called step and flash imprint lithography (SFIL), which may be used to pattern a substrate in small steps in a similar manner to optical steppers conventionally used in IC manufacture. For more information on UV imprint, see e.g. U.S. Patent Application Publication No. 2004-0124566, U.S. Pat. No. 6,334,960, PCT Patent Application Publication No. WO 02/067055, and the article by J. Haisma entitled "Mold-assisted nanolithography: A process for reliable pattern replication", J. Vac. Sci. Technol. B14(6), November/December 1996.

Combinations of the above imprint techniques are possible. See, e.g., U.S. Patent Application Publication No. 2005-0274693, which mentions a combination of heating and UV curing an imprintable medium.

Figure 3:
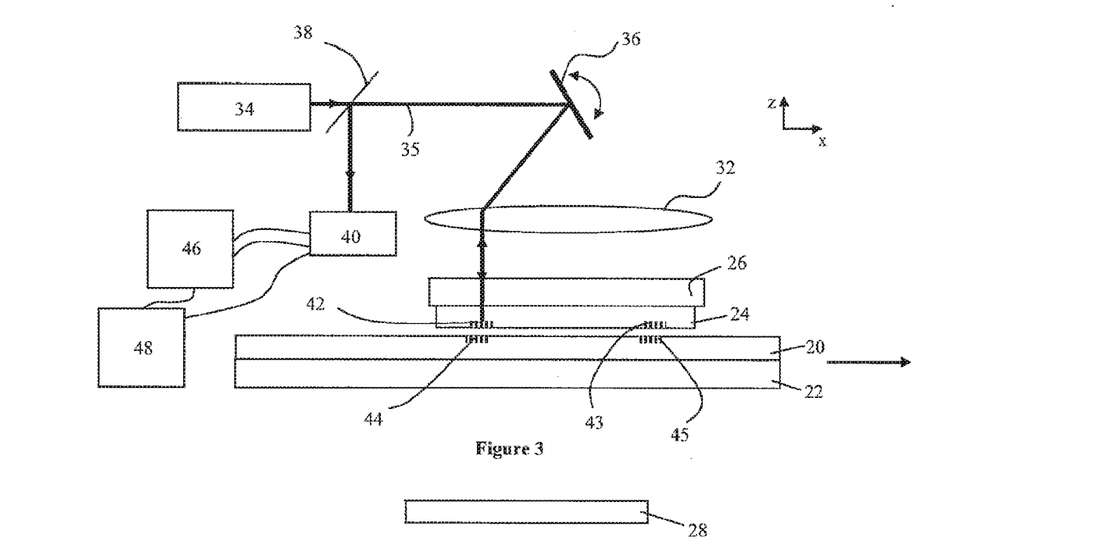

FIG. 3 shows schematically an imprint lithography apparatus according to an embodiment of the invention. Referring to FIG. 3, a substrate 20 bearing a layer of imprintable medium (not shown) is provided on a substrate table 22. An imprint template 24 is held by an imprint template holder 26. A output of actinic radiation 28 (for example, a UV radiation source) is provided above the imprint template holder 26. A lens 32 is provided between the actinic radiation output 28 and the imprint template holder 26.

The lithographic apparatus further comprises an output 34 (e.g., a source) which emits radiation (e.g. non-actinic radiation). The output 34 will hereafter be referred to as the alignment beam output 34. The alignment beam output 34 generates a collimated beam of radiation which will hereafter be referred to as the alignment radiation beam 35. The output 34 may be configured to emit radiation at multiple wavelengths, which may for example include visible radiation and infrared radiation. In an embodiment, the output 34 is a radiation beam source. In an embodiment, the alignment radiation beam output 34 receives alignment radiation from a source located outside of the lithographic apparatus and outputs the alignment radiation beam inside the lithographic apparatus.

A tip-tilt mirror 36 is provided above the imprint template holder 26. The tip-tilt mirror 36 can be tilted around the y and z axes, and is arranged to be moved between a plurality of orientations. Different orientations of the tip-tilt mirror 36 may direct the alignment radiation beam towards different alignment gratings 42, 43 provided on the imprint template 24. It is not essential that the tip-tilt mirror be arranged to tilt around the y and z axes; any suitable axes may be used. Any other suitable beam directing apparatus may be used instead of the tip-tilt mirror, such as a combination of moveable mirrors.

The lithographic apparatus further comprises a beam-splitter 38 and detector 40. The beam-splitter 38 is arranged to direct towards the detector 40 a portion of the alignment radiation beam 35 which has been diffracted from the substrate 20 and/or from the imprint template 24, as is explained below. The alignment radiation which is detected by the detector 40 may be used to align the substrate 20 and the imprint template 24.

The detector 40 may be capable of distinguishing between different wavelengths of the alignment radiation beam 35. Where this is the case, the detector 40 may be able to detect and provide output signals for a plurality of wavelengths. Similarly, the detector 40 may be capable of distinguishing between different polarizations of the alignment radiation beam 35. Where this is the case, the detector 40 may be able to detect and provide output signals for a plurality of polarizations.

Signals which are output from the detector 40 are passed to a processor 46. The processor 46 uses the signals to direct align the substrate 20 with respect to the imprint template 24 (and/or to align the imprint template with respect to the substrate). A controller 48 is connected to the processor. The controller 48 controls the position of the substrate table 22 (and/or the imprint template holder 26) in the x, y and z directions. The substrate table 22 may be moved, for example, by one or more motors (not shown) of a type known to those skilled in the art. The position of the substrate table 22 may be monitored, for example, by one or more interferometers or encoders (not shown) of a type known to those skilled in the art.

During alignment, there is no actinic radiation supplied from output 28 (e.g., the source connected to the output is switched off or the actinic radiation is blocked) such that actinic radiation is not directed onto the imprint template 24. A substrate 20 which has been provided with a layer of imprintable medium (not shown) is then placed on the substrate table 22. Coarse alignment of the substrate 20 and the imprint template 24 may then be performed (described further below). The substrate table is then moved until a target portion (e.g. a die) of the substrate 20 is positioned beneath the imprint template 24, and the imprint template alignment marks 42, 43 are located over alignment gratings 44, 45 provided on the substrate.

Alignment of the target portion of the substrate 20 with the imprint template 24 is achieved in the following manner. The tip-tilt mirror 36 is oriented such that it directs the alignment radiation beam 35 towards a first imprint template alignment grating 42. A proportion of the alignment radiation beam 35 will be diffracted from the imprint template alignment grating 42, and a proportion of the alignment radiation beam will pass onto the substrate alignment grating 44. A proportion of the alignment radiation beam 35 will then be diffracted by the substrate alignment grating 44. The diffracted alignment radiation (i.e. alignment radiation which has been diffracted from the imprint template alignment grating 42 or the substrate alignment grating 44) passes back to the tip-tilt mirror 36. The tip-tilt mirror directs the diffracted alignment radiation towards the beam-splitter 38, which in turn directs the diffracted alignment radiation towards the detector 40. The detector provides output signals which pass to the processor 46.

The substrate table 22 (and substrate 20) move in the x-direction while the alignment measurement is being made. This may be considered to be an example of a lateral movement (lateral movement may be considered to mean movement in a plane which is parallel or substantially parallel to the surface of the substrate). The movement may be a scanning motion over a length that is normally (but not necessarily) one or more periods of the substrate alignment grating 44. Alternatively, the movement may be a modulation over a length which is less than the pitch of the substrate grating. As a result of this movement, the substrate alignment grating 44 moves beneath the imprint template alignment grating 42, thereby giving rise to a modulation of the diffracted alignment radiation. This modulation is measured by the detector 40 and is passed to the processor 46. Properties of the modulation are linked to the relative position of the substrate alignment grating 44 and the imprint template alignment grating 42, and these properties may thus be used to align the substrate 20 and the imprint template 24.

The detector may measure the modulation at a plurality of wavelengths, and provide a plurality of output signals accordingly. Where this is the case, the output signals are passed to the processor 46, which uses the output signals to determine the position of the substrate alignment grating 44 relative to the imprint template alignment grating 42.

Figure 4:
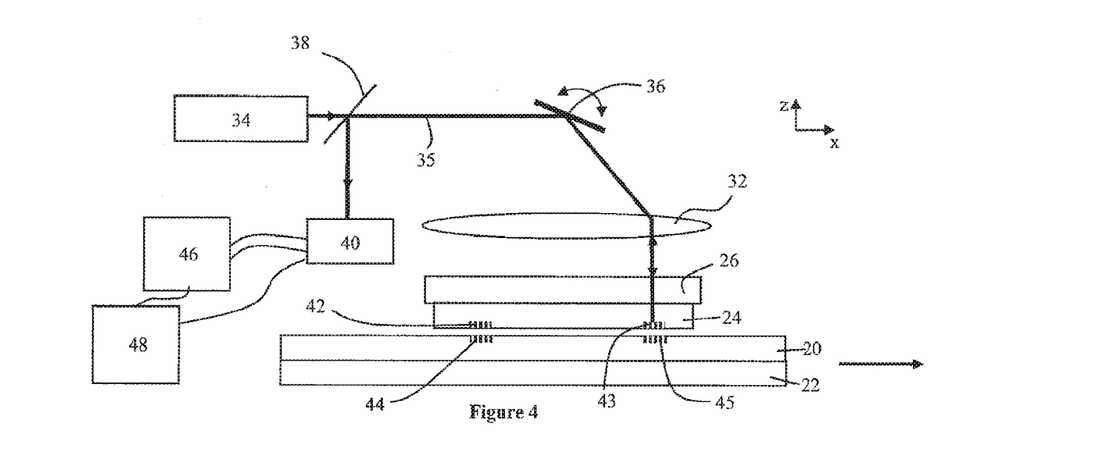

Referring to FIG. 4, the tip-tilt mirror 36 is then moved to a new orientation, such that the alignment radiation beam 35 is directed towards a second imprint template alignment grating 43 and associated substrate alignment grating 45. Again, a portion of the alignment radiation beam 35 is diffracted, and passes via the tip-tilt mirror 36 and beam-splitter 38 to the detector 40. The substrate table 22 (and substrate 20) move with a scanning motion or modulation in the x-direction, thereby giving rise to a modulation of the diffracted alignment radiation. The detector 40 provides output signals which pass to the processor 46. The processor 46 uses the signals to determine the relative position of the substrate alignment grating 45 and the imprint template alignment grating 43.

The tip-tilt mirror 36 may then be moved to other orientations in order to direct the alignment radiation beam 35 towards other alignment gratings (not shown).

The processor 46 uses the signals output from the detector 40 to determine the aligned position of the substrate 20 relative to the imprint template 24 (or of the imprint template 24 relative to the substrate 20). The aligned position may, for example, be the position in which a pattern provided on the imprint template 24 is aligned with a pattern provided on the substrate 20 (e.g. a previously formed layer of a die). Once the aligned position has been determined, the substrate 20 and/or imprint template 24 is moved to the aligned position. This is may be achieved, for example, by moving the substrate table 22 using a motor, while monitoring the position of the substrate table using an interferometer. In addition to moving the substrate 20, the size of the imprint template 24 may be adjusted using one or more actuators (not shown).

Figure 5:
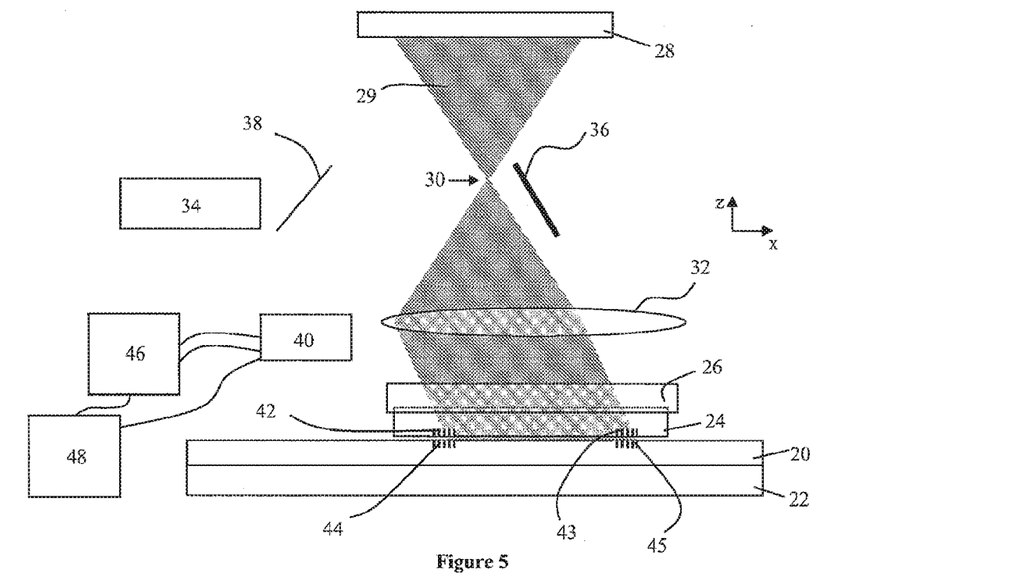

Once the substrate and the imprint template have been aligned, the imprint template holder 26 is lowered (and/or the substrate table is raised) so that the imprintable medium flows into pattern recesses of the imprint template 24. As shown in FIG. 5, the radiation output 28 provides a beam of actinic radiation 29 which is directed onto the imprintable medium. The beam of actinic radiation 29 passes through a focal area or focal point 30 (focal area if the actinic radiation output 28 is an extended output; focal point if the actinic radiation output 28 is a point source). The lens 32, which is located some distance beyond the focal point 30, is arranged to collimate the actinic radiation beam 29, and to direct it through the imprint template holder 26 and imprint template 24 onto the imprintable medium.

The actinic radiation beam 29 passes through the focal point or focal area 30 in order to allow the tip-tilt mirror 36 to be provided above the imprint template holder 26, without the actinic radiation beam 29 hitting the tip-tilt mirror. Other arrangements of the actinic radiation and the tip-tilt mirror 36 may be used. For example, the tip-tilt mirror may be provided in some other location, and/or a beam-directing apparatus other than a tip-tilt mirror may be used to direct the alignment radiation beam 35 towards the imprint template. For example, a lens system, mirror array or other optical device may be used. The actinic radiation output may be provided in a different location, with the actinic radiation beam being directed to the imprint template for example by beam steering mirrors.

The actinic radiation beam 29 cures the imprintable medium, and thereby causes it to solidify. Once curing has taken place, the imprint template 24 and substrate 20 are separated. The substrate table 22 (and/or imprint template holder 26) is then moved in the x or y direction until a different target portion (e.g. a different die) of the substrate 20 is located beneath the imprint template 24. The alignment and imprinting process is then repeated.

The alignment gratings 42-45 are diffraction gratings. They may, for example, have a pitch of 400 nm. Referring to FIG. 3, during the alignment process, adjacent alignment gratings 42, 44 may be separated by, for example, 2 microns or less. This is sufficiently close that the adjacent alignment gratings couple with each other to form a composite diffraction grating. Another way of expressing this is to say that a diffraction order from one alignment grating 42 acts as a new illumination beam for the other alignment grating 44, which results in an interplay of propagating diffraction orders between the alignment gratings.

As a result of the coupling of the adjacent alignment gratings 42, 44 to form a composite diffraction grating, the intensity of the 0th diffraction order (specular reflection) becomes a periodic function of the relative x-positions of the adjacent alignment gratings 42, 44. Since the substrate 20 moves in a scanning motion in the x-direction (or is modulated in the x-direction) during alignment, this periodic function gives rise to modulation of the intensity of the diffracted alignment radiation. This intensity-modulated diffracted alignment radiation passes via the tip-tilt mirror 36 and the beam splitter 38 to the detector 40. The measured signal may be used by the processor 46 to determine the position of the substrate alignment grating 44 relative to the imprint template alignment grating 42. This can, for example, be done by fitting a set of sinusoidal and cosinusoidal functions to the measured signal in a manner that is known to a person skilled in the art. The substrate 20 may then, for example, be moved in the x-direction such that it is in the aligned position (in the x-direction) with respect to the imprint template 24.

The measured signal may include noise arising from variations in the separation between the imprint template alignment grating 42 and the substrate alignment grating 44. A signal measured at a longer wavelength will vary according to the separation between the imprint template alignment grating 42 and the substrate alignment grating 44, and can therefore be used to remove (or reduce) the noise from the signal measured at the shorter wavelength.

It is desirable to be able to imprint different patterns using the imprint lithography apparatus. In order to allow the imprint of different patterns, an imprint template 24 may be removed from the imprint template holder 26 and may be replaced with a different imprint template. The accuracy with which the imprint template 24 is positioned in the imprint template holder 26 may be relatively low, for example be in the range of 40 to 100 microns. Given the relatively low accuracy with which the imprint template 24 is positioned in the imprint template holder 26, it may be necessary to determine the positions of the imprint template alignment gratings 42, 43 in order to ensure that they are correctly illuminated by the alignment radiation beam 35.

In an embodiment, the alignment radiation beam 35 has a cross-sectional dimension, e.g., diameter, of around 20 microns and thus provides a 'measurement spot' with a cross-sectional dimension of around 20 microns (the 'measurement spot' is the area illuminated by the alignment radiation beam). The imprint template alignment gratings 42, 43 may measure 40×40 microns. It is desirable for the measurement spot of the alignment radiation beam 35 to lie fully within the imprint template alignment gratings 42, 43, in order to provide optimum alignment results. Thus, it is desirable to measure the positions of the imprint template alignment gratings 42, 43 in order to ensure that the measurement spot is located within the imprint template alignment gratings when alignment measurements are being performed.

In order to determine the positions of the imprint template alignment gratings 42, 43, the tip-tilt mirror 36 is moved such that the measurement spot of the alignment radiation beam 35 scans over an area on the imprint template in which an imprint template alignment grating is expected to be found. This scanning of the measurement spot using the tip-tilt mirror 36 may, for example, be controlled by the controller 46. The scanning of the measurement spot may be a raster scan (although other scan types may be used).

The area over which the measurement spot is scanned is sufficiently large that the imprint template alignment grating is expected to fall within that area. The size of the area may take into account the accuracy with which the imprint template 24 is positioned in the imprint template holder 26. The detector 40 detects radiation which is reflected from the imprint template as a function of the position of the measurement spot.

The imprint template alignment gratings 42, 43 may have a reflectance which differs from the reflectance of other areas of the imprint template. The imprint template alignment gratings may thus be identified by comparing the intensity of the detected radiation reflected from different locations within the area. This comparison may be performed by the processor 46.

The reflected radiation may be monitored for an intensity which is expected when the imprint template alignment gratings 42, 43 are illuminated. The expected intensity of reflected radiation may be determined, for example, using a calibration measurement, or may be, for example, calculated based upon the reflectance of the imprint template alignment gratings. The imprint template gratings may be identified by comparing the intensity of the detected radiation with the expected intensity. This comparison may be performed by the processor 46.

Either of the above comparisons may be performed. Alternatively, both of the comparisons may be performed.

Figure 6:
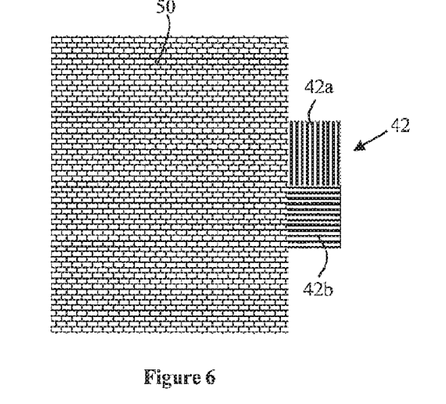
FIGS. 6 and 7 schematically shows part of an imprint template and an intensity image which may be used by an embodiment of the invention.

FIG. 6 shows schematically viewed from above, part of an imprint template which comprises a product pattern 50 (i.e. a pattern which will form part of an integrated circuit or other device when imprinted onto a substrate). FIG. 6 also shows an imprint template alignment grating 42 comprising a grating 42a which extends in the x-direction and a grating 42b which extends in the y-direction.

Figure 7:
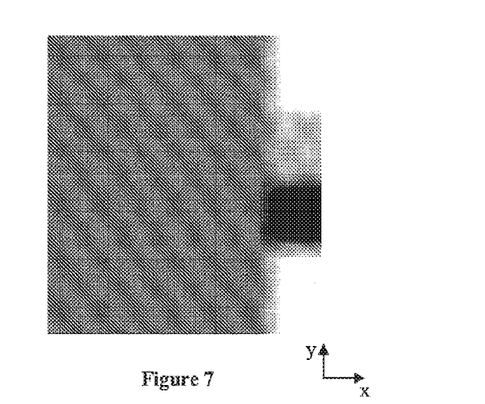

FIG. 7 shows a measured intensity image of the part of the imprint template shown in FIG. 6. The measured intensity image is created by monitoring the intensity of radiation detected by the detector 40 as a function of the position of the measurement spot of the alignment radiation beam 35 on the imprint template. As can be seen from FIG. 7, the x-direction grating 42a and the y-direction grating 42b are clearly distinguishable from the product pattern 50, and are clearly distinguishable from each other. Thus, the measured intensity image may be used to determine the locations of the x-direction grating 42a and the y-direction grating 42b (i.e. the position of the imprint template alignment grating 42).

The intensity measurement may be performed at a plurality of wavelengths. Using a plurality of wavelengths may improve the accuracy and/or robustness with which the position of the imprint template alignment grating 42 is determined. The reflectance of the imprint template alignment grating 42 as a function of wavelength may be known. This information may be stored and used by the processor 46 for wavelengths of radiation included in the alignment radiation beam 35.

Similarly, the intensity measurement may be performed for a plurality of polarizations (a plurality of polarizations may be used in the alignment radiation beam 35). The reflectance of the x-direction grating and the y-direction grating as a function of polarization may be known, and may be stored and used by the processor 46. This information may be stored and used by the processor 46 for polarizations which are included in the alignment radiation beam 35.

The processor 46 may look within the measured intensity image for locations which match with (or correspond to within a certain threshold) expected intensity values for imprint template alignment marks. The processor 46 may take into account wavelengths and polarizations used in the alignment radiation beam 35.

Referring again to FIG. 7, the measured intensity image has been obtained using an alignment radiation beam which is polarized in the y-direction. The y-polarized radiation is reflected by the x-direction grating 42a and gives rise to a high intensity area in the image, whereas the y-direction polarized radiation is not reflected by the y-direction grating 42b and gives rise to a low intensity area in the image. Thus, the measured intensity image allows identification of the x-direction grating 42a and the y-direction grating 42b.

Measurement of the position of the imprint template alignment gratings 42, 43 may be performed without a substrate being present in the imprint lithography apparatus. In an embodiment, a mirror may be located on the substrate table 22 when the positions of the imprint template alignment gratings 42, 43 are being measured. The mirror may increase the amount of alignment radiation received by the detector 40, and therefore improve the signal to noise ratio of the measurement. The mirror may, for example, have the same or similar dimensions as a substrate.

The position of each imprint template alignment grating present on the imprint template may be measured using the above described method. Alternatively, the position of a subset of the imprint template alignment gratings may be measured, the positions of other imprint template alignment gratings being calculated based upon the measured position (s) of the subset of imprint template alignment gratings.

The embodiment of the apparatus shown in FIG. 2 has a single output 34, a single tip-tilt mirror 38 and a single detector 40. However, more than one output, tip-tilt mirror and detector may be provided in the lithographic apparatus. For example, two, three, four or more outputs, tip-tilt mirrors and detectors may be provided in the lithographic apparatus. The number of outputs, tip-tilt mirrors and detectors may correspond with the number of alignment gratings present on the imprint template 24. In some instances, the same output may be used for more than one tip-tilt mirror and detector. An advantage which may arise from having separate tip-tilt mirrors and detectors for each alignment grating is that the angle of incidence of the alignment radiation beam on the alignment grating may be lower than would be the case for example if a single tip-tilt mirror and detector were to be used, thereby providing higher accuracy measurements. The alignment radiation beams may be substantially perpendicularly incident upon the alignment gratings.

The positions of the imprint template alignment gratings may be measured each time an imprint template 24 is loaded into the imprint template holder 26. Since this happens relatively infrequently, the time required for the measurement to be performed does not have a significant impact upon the throughput of the imprint lithography apparatus.

The tip-tilt mirror 38 is an example of a beam directing apparatus. Any other suitable beam directing apparatus may be used. The beam directing apparatus may be controlled by the controller 48.

The imprint template alignment grating 42 is an example of an imprint template alignment mark. Embodiments of the invention may be used to determine the position of any suitable imprint template alignment mark.

Embodiments of the invention use a detector 40 to detect radiation which has been reflected from the imprint template alignment mark. This is advantageous because it allows the same detector 40 to be used that will subsequently be used to measure alignment of the imprint template 24 and substrate 20. In an alternative embodiment, a detector (not shown) may be located beneath the imprint template 24, and may be used to measure alignment radiation which is transmitted by the imprint template alignment mark.

Embodiments of the invention allow the positions of imprint template alignment marks to be measured without adding any additional hardware to the imprint lithography apparatus (the hardware which is used is already present in order to provide alignment of the substrate and the imprint template). Embodiments of the invention may therefore be cheaper and simpler than using an additional detector such as an imaging detector to determine the positions of the imprint template alignment marks.

An embodiment of the invention may scan the imprint template 24 relative to the alignment radiation beam 35, instead of (or in addition to) scanning the alignment radiation beam relative to the imprint template.

An embodiment of the invention may be used to obtain coarse alignment of the substrate 20 relative to the imprint template 24. As mentioned further above, when alignment is to take place, the substrate table 22 is moved until a target portion (e.g. a die) of the substrate 20 is positioned beneath the imprint template 24, and the imprint template alignment gratings 42, 43 are located over the substrate alignment gratings 44, 45. The accuracy with which the substrate table is positioned in this initial alignment phase is such that the imprint template alignment gratings 42, 43 and substrate alignment gratings 44, 45 are positioned sufficiently accurately to allow alignment (sometimes referred to as fine alignment) to be performed. In order to ensure that the accuracy of the initial alignment phase is sufficient, so called coarse alignment of the substrate 20 to the imprint template 24 may be performed. Coarse alignment may be performed when the substrate is loaded into the imprint lithography apparatus.

Coarse alignment of the substrate to the imprint template should position the substrate such that the substrate alignment gratings 44, 45 are within the capture range of the imprint template alignment gratings 42, 43. The term 'capture range' is intended to mean the range of misalignments of the substrate 20 from the aligned position over which alignment can be achieved using the alignment gratings 42-45. The capture range of an embodiment of the invention may be less than the pitch of the alignment gratings. The capture range may be approximately a quarter of the pitch of the alignment gratings. Thus, the coarse alignment may determine the position of the substrate alignment gratings with an accuracy which is greater than the pitch of the alignment gratings, and which may be greater than a quarter of the pitch of the alignment gratings.

Figure 8:
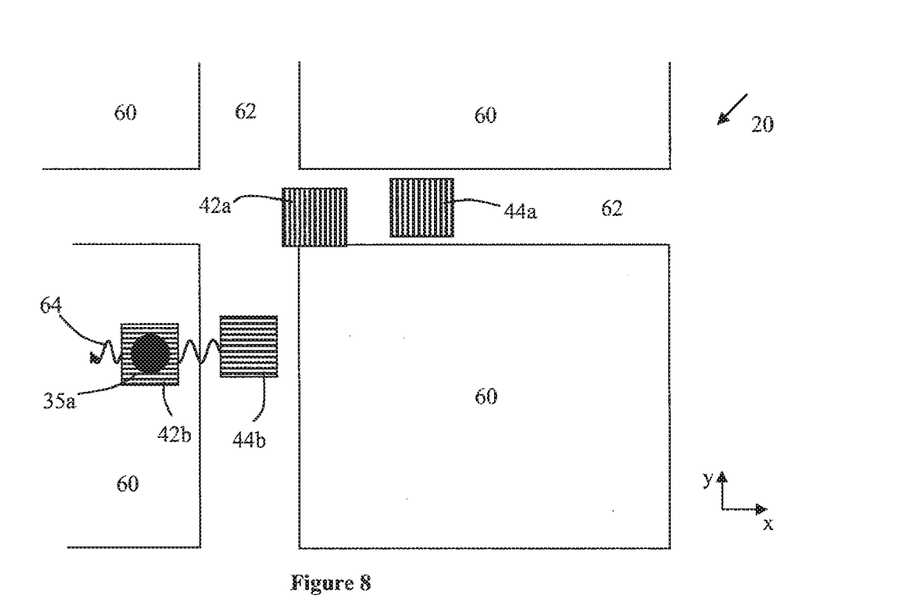
FIGS. 8 and 9 schematically show use of imprint template alignment gratings and substrate template alignment gratings according to an embodiment of the invention.
Figure 9:
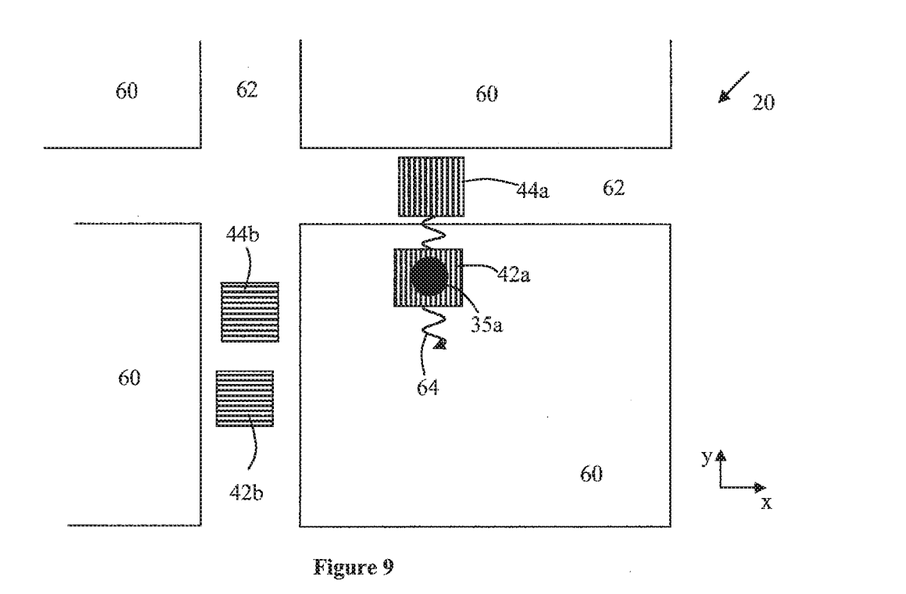

Coarse alignment of the substrate alignment gratings 44, 45 relative to the imprint template alignment gratings 42, 43 may be achieved using the following method, which is described in relation to FIGS. 8 and 9. FIGS. 8 and 9 show schematically, viewed from above, part of a substrate 20 upon which four dies 60 have been provided. The dies 60 are separated by scribe lanes 62. A substrate alignment grating is provided in the scribe lanes 62, the substrate alignment grating 44 comprising an x-direction grating 44a and a y-direction grating 44b. Also shown is an imprint template alignment grating 42 which comprises an x-direction grating 42a and a y-direction grating 42b.

Coarse alignment of the substrate 20 relative to the imprint template is performed separately for the x-direction and the y-direction. Referring first to FIG. 8, coarse alignment in the x-direction is obtained by modulating the position of the substrate 20 in the y-direction at the same time as moving the substrate in the x-direction (in this case the negative x-direction as indicated schematically by an arrow 64). The y-direction imprint template grating 42b is illuminated by the alignment radiation beam such that the measurement spot 35a lies within the y-direction imprint template grating 42b. Alignment radiation reflected from the y-direction imprint template grating is detected by the detector 40 (see FIG. 2).

When the y-direction substrate grating 44b is positioned as shown in FIG. 8, there is no overlap between the y-direction substrate grating 44b and the y-direction imprint template grating 42b. Thus, no modulation of the reflected alignment radiation beam is seen at the detector 40. The y-direction substrate grating 44b will in due course begin to overlap with the y-direction imprint template grating 42b, giving rise to modulation of the reflected alignment radiation beam. The size of this overlap will gradually increase, and the amplitude of the modulation will increase accordingly. The overlap will pass through a maximum when the x-direction positions of the gratings 42b, 44b are the same. Following this, the overlap will gradually decrease until there is no overlap, with the amplitude of the modulation decreasing accordingly.

Since the amplitude of the modulation seen by the detector 40 depends upon the overlap between the y-direction substrate grating 44b and the y-direction imprint template grating 42b, the maximum modulation indicates alignment of those gratings in the x-direction. The processor 46 (see FIG. 2) may determine the maximum modulation via suitable analysis of the modulated signal. The analysis may, for example, include curve fitting, interpolation or any other suitable technique. In some instances, the width of the y-direction substrate grating 44b may differ from the width of the y-direction imprint template grating 42b. Where this is the case, the modulated signal may have a maximum value in the form of a plateau. The analysis may determine the center of the plateau.

Once the aligned position in the x-direction of the y-direction gratings 42b, 44b has been determined, this may be used to determine the aligned position in the x-direction of the neighboring x-direction gratings 42a, 44a. The distance in the x-direction between the x-direction substrate grating 44a and the y-direction substrate grating 44b is known (this is a known property of the substrate). Thus, the position in the x-direction of the x-direction substrate grating 44a may be calculated. Similarly, the distance between the x-direction imprint template grating 42a and the y-direction imprint template grating 42b is known (this is a known property of the imprint template). Thus, the positions in the x-direction of the x-direction substrate grating 44a and the x-direction imprint template grating 42a may be calculated. The positions are calculated with sufficient accuracy that fine alignment of the substrate relative to the imprint template may subsequently be achieved using the x-direction gratings 42a, 44a. In other words, coarse alignment in the x-direction has been achieved.

The same approach may be used to achieve coarse alignment of the x-direction imprint template grating 42a and the x-direction substrate grating 44a (and therefrom the y-direction imprint template grating 42b and the y-direction substrate grating 44b). Referring to FIG. 9, coarse alignment in the y-direction is obtained by modulating the position of the substrate 20 in the x-direction at the same time as moving the substrate in a scanning motion in the y-direction (in this case in the negative y-direction as indicated schematically by an arrow 64). The x-direction imprint template grating 42a is illuminated by the alignment radiation beam such that the measurement spot 35a lies within the x-direction imprint template grating 42a. Alignment radiation reflected from the x-direction imprint template grating 42a is detected by the detector 40 (see FIG. 2).

When the x-direction substrate grating 44a is positioned as shown in FIG. 9, there is no overlap between the x-direction substrate grating 44a and the x-direction imprint template grating 42a. Thus, no modulation of the reflected alignment radiation beam is seen at the detector 40. The x-direction substrate grating 44a will in due course begin to overlap with the x-direction imprint template grating 42a, giving rise to modulation of the reflected alignment radiation beam. The size of this overlap will gradually increase, and the amplitude of the modulation will increase accordingly. The overlap will pass through a maximum when the y-direction positions of the gratings 42a, 44a are the same. Following this, the overlap will gradually decrease until there is no overlap, with the amplitude of the modulation decreasing accordingly.

Since the amplitude of the modulation seen by the detector 40 depends upon the overlap between the x-direction substrate grating 44a and the x-direction imprint template grating 42a, the maximum modulation indicates alignment of those gratings in the y-direction. The processor 46 (see FIG. 2) may determine the maximum modulation via suitable analysis of the modulated signal. The analysis may, for example, include curve fitting, interpolation or any other suitable technique.

Once the aligned position in the y-direction of the x-direction gratings 42a, 44a has been determined, this may be used to determine the aligned position in the y-direction of the y-direction gratings 42b, 44b. The distance in the y-direction between the y-direction substrate grating 44b and the x-direction substrate grating 44a is known (this is a known property of the substrate). Thus, the position in the y-direction of the y-direction substrate grating 44b may be calculated. Similarly, the distance between the y-direction imprint template grating 42b and the x-direction imprint template grating 42a is known (this is a known property of the imprint template). Thus, the positions in the y-direction of the y-direction substrate grating 44b and the y-direction imprint template grating 42b may be calculated. The positions are calculated with sufficient accuracy that fine alignment of the substrate relative to the imprint template may subsequently be achieved using the y-direction gratings 42b, 44b. In other words, coarse alignment in the y-direction has been achieved.

The modulation 64 which is shown in FIGS. 8 and 9 has been exaggerated for the purpose of illustration. In practice, the modulation may be smaller than the pitch of the alignment gratings 42a,b, 44a,b. The modulation may be, for example, less than or equal to half the pitch of the alignment gratings, less than or equal to a quarter of the pitch of the alignment gratings, or smaller than that. In an embodiment, the pitch of the alignment gratings may be around 500 nanometers, and the amplitude of the modulation may be 100 nm or less. The modulation may, for example, have a frequency of around 1 kHz.

It is not necessary that the direction of the modulation is perpendicular to the direction of movement of the substrate. The direction of modulation should include a component which is perpendicular to the direction of movement of the substrate. For example, referring to FIG. 8, the direction of movement is the x-direction. The modulation need not be in the y-direction, but should include a component which is in the y-direction.

Although the above description refers to performing coarse alignment in the x-direction, and then performing coarse alignment in the y-direction, coarse alignment in the y-direction may be performed before coarse alignment in the x-direction.

Coarse alignment of the substrate and the imprint template may be achieved using the method described above each time a substrate 20 is loaded into the imprint lithography apparatus. Once coarse alignment has been achieved, the positions of alignment gratings across the substrate 20 may be known with sufficient accuracy to allow fine alignment of the imprint template 24 to be achieved across the substrate (e.g. fine alignment of the imprint template to dies 60 on the substrate).

In some instances, the method described above may be repeated for substrate alignment gratings at a second location on the substrate 20. Where this is done, coarse alignment measurements are obtained for two different locations on the substrate 20, the two locations being spaced apart on the substrate. These two coarse alignment measurements may be used to obtain more accurate coarse alignment, which may for example correct for rotation of the substrate.

In some instances, the method described above may be repeated for substrate alignment gratings at three or more different locations on the substrate 20, thereby providing more accurate coarse alignment.

In an embodiment, the method described above may be repeated for substrate alignment gratings at four different locations on the substrate 20. Calculations for the four alignment gratings may be performed simultaneously, for example using a model which is solved. The result of the calculation may provide coarse alignment which takes into account translation in the x and y directions, rotation, and expansion of the substrate.

Since the method is used a relatively small number of times per substrate, the impact of the method on the speed at which substrates may be imprinted by the imprint lithography apparatus is relatively low.

The embodiment of the apparatus shown in FIG. 2 has a single output 34, a single tip-tilt mirror 38 and a single detector. However, more than one output, tip-tilt mirror and detector may be provided in the lithographic apparatus. For example, two, three, four or more outputs (e.g., two, three, four or more sources), tip-tilt mirrors and detectors may be provided in the lithographic apparatus. Thus, coarse alignment measurements may be obtained simultaneously at more than one location. In an embodiment, a plurality of coarse alignment measurements in the x-direction may be obtained simultaneously, followed by a plurality of coarse alignment measurements in the y-direction (or vice-versa).

The coarse alignment may be sufficiently accurate that it provides alignment of substrate alignment gratings and imprint template alignment gratings to within one alignment grating period (i.e. provides an accuracy which is finer than the pitch of the alignment gratings). In an embodiment, the pitch of the alignment gratings may be 500 nm, and the accuracy of the coarse alignment may be better than 500 nm.

An advantage provided by the coarse alignment method described above is that it does not require any additional hardware to be provided in the imprint lithography apparatus (the hardware which is used is the same hardware that is used by the fine alignment method).

The coarse alignment method should align the substrate 20 and the imprint template 24 to within the capture range provided by the alignment gratings 23, 24. The term 'capture range' is intended to mean the range of misalignments from over which alignment can be achieved using the alignment gratings. The capture range of an embodiment may be less than or equal to the pitch of the alignment gratings. The capture range may be approximately a quarter of the pitch of the alignment gratings 23, 24. This link between the capture range and the grating pitch may influence the grating pitch which is used. A smaller grating pitch may provide more accurate fine alignment, but may require a higher accuracy of coarse alignment, in order to ensure that the coarse alignment aligns the alignment gratings within the capture range.

In some instances it may be possible to increase the capture range of the alignment gratings without giving rise to a corresponding reduction of the accuracy of fine alignment which may be achieved.

Figure 10:
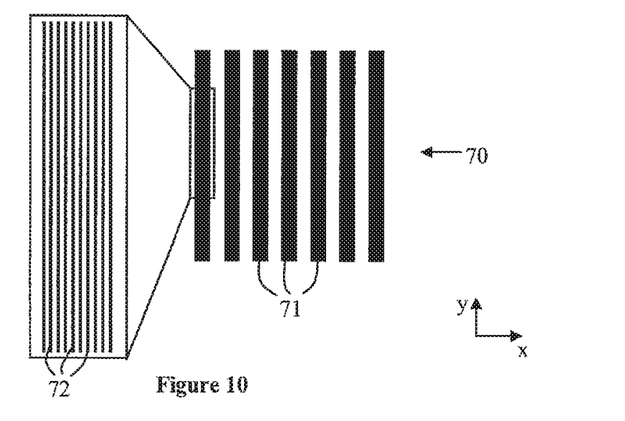
FIGS. 10 to 13 schematically show alignment gratings according to an embodiment of the invention.

Referring to FIG. 10, an alignment grating 70 may comprise a low resolution grating, lines of the low resolution grating being formed from high resolution gratings. In this context the term 'low resolution' is intended to mean a resolution which is lower than the resolution of the 'high resolution' grating. Similarly, the term 'high resolution' is intended to mean a resolution which is higher than the resolution of the 'low resolution' grating. Neither term is intended to imply a specific resolution. The low resolution grating comprises a set of lines 71 which are referred to hereafter as thick lines 71. Each of the thick lines 71 comprises a set of lines 72, hereafter referred to as thin lines 72. The thin lines 72 extend in substantially the same direction as the thick lines 71. The thick lines 71 of the grating 70 may be used to obtain coarse alignment over a large capture range. The thin lines 72 of the alignment grating 70 may then be used to obtain fine alignment with high resolution. The pitch of the thick lines 71 may be, for example, selected from the range of 5 to 10 microns, and the pitch of the fine lines 72 may be, for example, selected from the range of 500 to 1000 nm. Other pitches may be used. The alignment grating 70 may be provided on an imprint template.

Figure 11:
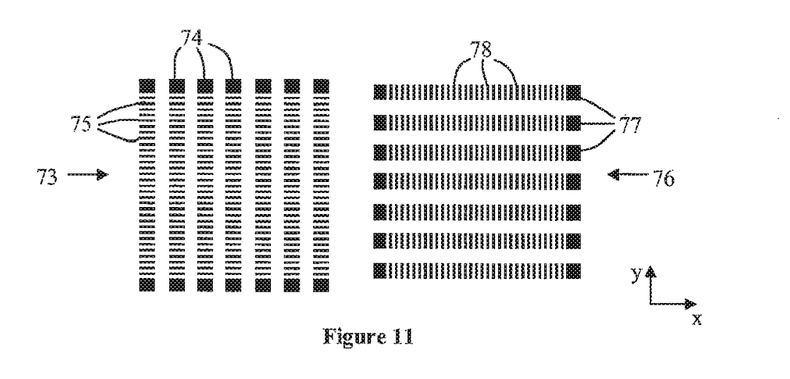

A further approach to extending the capture range of an alignment grating is shown in FIG. 11. A first alignment grating 73 comprises lines 74 extending in the x-direction (hereafter referred to as thick lines), which are formed from gratings comprising lines 75 which extend in the y-direction (hereafter referred to as thin lines). A second alignment grating 76 comprises lines 77 extending in the y-direction (hereafter referred to as thick lines) which are formed from gratings comprising lines 78 which extend in the x-direction (hereafter referred to as thin lines). The thin lines extend in a direction which is substantially transverse to the direction of the thick lines. The thick lines 74 of the first alignment grating 73 may be used to provide coarse alignment over a large capture range in the x-direction. The thin lines 78 of the second alignment grating 76 may then be used to obtain fine alignment in the x-direction. Similarly, the thick lines 77 of the second alignment grating may be used to obtain coarse alignment in the y-direction, and the thin lines 75 of the first alignment grating 73 may be used to obtain fine alignment in the y-direction. The pitch of the thick lines 74, 77 may be, for example, selected from the range of 5 to 10 microns. The pitch of the thin lines 75, 78 may be, for example, selected from the range of 500 to 1000 nm. Other pitches may be used. The alignment gratings 73, 76 may be provided on an imprint template.

Alignment radiation which is used to illuminate the alignment gratings 73, 76 of FIG. 11 may have a linear polarization. When fine alignment is being performed in a given direction, the polarization of the alignment radiation beam may be parallel to the thin lines which extend in that direction. Where this is done, a portion of the alignment radiation may propagate through gaps between the thin lines, thereby allowing fine alignment to be performed. When coarse alignment is being performed in a given direction, the polarization of the alignment radiation beam may be perpendicular to the thin lines which extend in that direction. This may cause the thin lines to appear opaque to the alignment radiation, thereby improving the contrast which is provided by the thick lines (compared with the contrast that would be obtained if the alignment radiation was polarized parallel to the thin lines).

Figure 12:
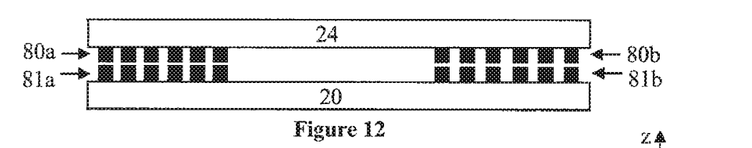
Figure 13:
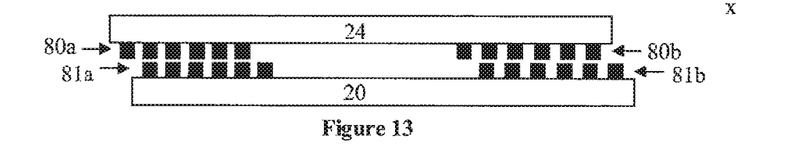

A further arrangement for increasing the capture range of the alignment gratings is shown in FIGS. 12 and 13. FIG. 12 shows an imprint template 24 which has been provided with first and second imprint template alignment gratings 80a, 80b, and a substrate 20 which has been provided with first and second substrate alignment gratings 81a, 81b. The pitch of the first imprint template alignment grating 80a is smaller than the pitch of the second imprint template alignment grating 80b. Similarly, the pitch of the first substrate alignment grating 81a is smaller than the pitch of the second substrate alignment grating 81b. As can be seen from FIG. 12, when the substrate 20 and the imprint template 24 are aligned, the first and second imprint template alignment gratings 80a, 80b are aligned respectively with the first and second substrate gratings 81a, 81b.

Referring to FIG. 13, when the substrate 20 and the imprint template 24 are not aligned, the misalignment between the first imprint template alignment grating 80a and the first substrate alignment grating 81a differs from the misalignment between the second imprint template alignment grating 80b and the second substrate alignment grating 81b. Analysis of the difference between the misalignments may allow the misalignment of the substrate 20 relative to the imprint template 24 to be calculated, thereby increasing the capture range of the alignment gratings (compared with the capture range that would be provided if the alignment gratings all had the same pitch).

The alignment radiation beam 35 may be a laser beam generated by a laser 34. The laser may be configured to generate alignment radiation at a plurality of wavelengths, which may include one or more visible wavelengths and one or more infrared wavelengths. Optics may be included in the laser 34, or downstream from the laser, which may be used to select or apply different polarizations to the alignment radiation beam 35.

The substrate alignment gratings 44, 45 may be partially reflective. The imprint template alignment gratings 42, 43 may be partially reflective.

The imprint template may be an imprint template which is sufficiently large to pattern an entire substrate in one go. Alternatively, multiple imprints of the imprint template onto the substrate may be required in order to pattern the substrate.

In the described embodiments, alignment (both coarse alignment and fine alignment) is achieved by moving the substrate table 20 in the x and y directions. However, it is possible to move the imprint template 24 in the x and y directions to achieve alignment. This may be done instead of, or as well as, movement of the substrate table 20 in the x and y directions. In general terms, it may be said that there is relative movement between the substrate and the imprint template.

Cartesian coordinates are shown in FIGS. 2 to 13 in order to facilitate explanation of those figures. The Cartesian coordinates follow lithographic convention, with the x and y directions being in the plane of the substrate 20, and the z-direction being perpendicular to the plane of the substrate. The Cartesian coordinates are not intended to imply that the substrate or the imprint template must have any specific orientation. Movements in the x and y directions may be considered to be examples of lateral movement (lateral movement may be considered to mean movement in a plane which is parallel or substantially parallel to the surface of the substrate).

In an embodiment, there is provided a method of determining a position of an imprint template in an imprint lithography apparatus, the method comprising: illuminating an area of the imprint template in which an alignment mark is expected to be found by scanning an alignment radiation beam over that area; detecting an intensity of radiation reflected or transmitted from the area; and identifying the alignment mark via analysis of the detected intensity.

In an embodiment, the analysis of the detected intensity comprises comparing the intensity of detected radiation reflected from different locations within the area. In an embodiment, the analysis of the detected intensity comprises comparing the intensity of detected radiation with an intensity which is expected when the alignment mark is illuminated. In an embodiment, a plurality of wavelengths of the alignment radiation beam are separately detected and analyzed. In an embodiment, a plurality of polarizations of the alignment radiation beam are separately detected and analyzed. In an embodiment, the scanning of the alignment radiation beam comprises a raster scan. In an embodiment, the alignment mark is a grating.

In an embodiment, there is provided an imprint lithography apparatus comprising: an imprint template holder configured to hold an imprint template; an alignment radiation beam outlet; a detector; and a processor, wherein the apparatus is configured to provide scanning movement between the imprint template and an alignment radiation beam provided by the alignment radiation beam outlet, such that the alignment radiation beam illuminates an area of the imprint template in which an alignment mark is expected to be found, the detector is configured to detect an intensity of radiation reflected or transmitted from the area, and the processor is configured to identify the alignment mark via analysis of the detected intensity.

In an embodiment, the scanning movement is provided by a beam directing apparatus configured to scan the alignment radiation beam such that the alignment radiation beam illuminates the area of the imprint template in which the alignment mark is expected to be found. In an embodiment, the processor is configured to compare the intensity of detected radiation when different locations within the area are illuminated. In an embodiment, the processor is configured to compare the intensity of detected radiation with an intensity which is expected when the alignment mark is illuminated. In an embodiment, the apparatus comprises an alignment radiation beam source configured to provide the alignment radiation beam at a plurality of wavelengths, and wherein the detector is configured to separately detect the plurality of wavelengths and the processor is configured to analyze the separately detected wavelengths.

In an embodiment, the apparatus comprises an alignment radiation beam source configured to provide the alignment radiation beam at a plurality of polarizations, and wherein the detector is configured to separately detect the plurality of polarizations and the processor is configured to analyze the separately detected polarizations. In an embodiment, the apparatus comprises a beam directing apparatus configured to scan the alignment radiation beam in a raster scan. In an embodiment, the alignment mark is a grating.

In an embodiment, there is provided a method of obtaining coarse alignment of a substrate and an imprint template, the method comprising: illuminating an imprint template alignment grating using an alignment radiation beam; providing relative movement between the substrate and the imprint template in a first lateral direction; providing a modulation between the substrate and the imprint template in a second lateral direction which includes a component that is perpendicular to the first lateral direction; detecting modulation of the alignment radiation when the relative movement between the substrate and the imprint template in the first lateral direction causes a substrate alignment grating and the imprint template alignment grating to overlap; and analyzing the detected modulation to determine a maximum overlap between the substrate alignment grating and the imprint template alignment grating, and to determine the relative positions of the substrate and the imprint template when the maximum overlap occurred.

In an embodiment, the imprint template alignment grating has a known separation in the first lateral direction from a further imprint template alignment grating, and the substrate alignment grating has a known separation in the first lateral direction from a further substrate alignment grating; and the method further comprises determining an aligned position of the further imprint template alignment grating and the further substrate alignment grating based upon the relative positions of the substrate and the imprint template when the maximum overlap occurred. In an embodiment, the amplitude of the modulation in the second lateral direction is smaller than the pitch of the imprint template and substrate alignment gratings. In an embodiment, the amplitude of the modulation in the second lateral direction is less than or equal to half of the pitch of the imprint template and substrate alignment gratings. In an embodiment, the method is repeated in a substantially perpendicular lateral direction.

In an embodiment, there is provided an imprint lithography apparatus comprising: an imprint template holder configured to hold an imprint template and a substrate holder configured to hold a substrate, the imprint template holder and/or the substrate holder configured to provide relative movement between the substrate and the imprint template in a first lateral direction, and configured to provide a modulation between the substrate and the imprint template in a second lateral direction which includes a component that is perpendicular to the first lateral direction; an alignment radiation beam outlet configured to illuminate an imprint template alignment grating; a detector configured to detect radiation reflected from the imprint template alignment grating and an adjacent substrate alignment grating; and a processor configured to determine a maximum of a modulation of the detected reflected alignment radiation, and to determine a maximum overlap between the substrate alignment grating and the imprint template alignment grating based on the determined maximum of the modulation, the maximum overlap providing coarse alignment of the substrate and the imprint template.

In an embodiment, there is provided an imprint template alignment grating comprising a low resolution grating formed from sets of lines which comprise high resolution gratings.

In an embodiment, the high resolution gratings extend in substantially the same direction as the low resolution gratings. In an embodiment, the high resolution gratings extend in a direction which is substantially transverse to the direction of the low resolution gratings.

In an embodiment, there is provided an imprint template and a substrate, the imprint template having a first imprint template alignment grating and a second imprint template alignment grating, and the substrate having a first substrate alignment grating and a second substrate alignment grating, wherein the pitch of the first imprint template alignment grating is smaller than the pitch of the second imprint template alignment grating, and the pitch of the first substrate alignment grating is smaller than the pitch of the second substrate alignment grating.

Although described embodiments of the invention use UV imprint lithography, an embodiment of the invention may use other forms of imprint lithography such as hot imprint lithography.

The present invention relates to imprint lithography apparatus and methods. The apparatus and/or methods may be used for the manufacture of devices, such as electronic devices and integrated circuits or other applications, such as the manufacture of integrated optical systems, guidance and detection patterns for magnetic domain memories, flat-panel displays, liquid-crystal displays (LCDs), thin film magnetic heads, organic light emitting diodes, etc.

In this specification, the term "substrate" is meant to include any surface layers forming part of the substrate, or being provided on another substrate, such as planarization layers or anti-reflection coating layers.

While specific embodiments of the invention have been described above, it will be appreciated that the invention may be practiced otherwise than as described. For example, an embodiment of the invention may take the form of a computer program containing one or more sequences of machine-readable instructions configured to cause performance of a method as disclosed above, or a computer-readable data storage medium (e.g. semiconductor memory, magnetic or optical disk) having such a computer program stored therein.

In the above embodiments, the lithography apparatus comprises a single imprint template. Thus, a single imprint template, a single imprint template holder, a single substrate holder and a single substrate is provided in a single chamber. In other embodiments, more than one imprint template, more than one imprint template holder, more than one substrate holder, and/or more than one substrate may be provided in one or more chambers, in order for imprints to be undertaken more efficiently or quickly (e.g. in parallel). For example, in an embodiment, there is provided an apparatus that includes a plurality (e.g. 2, 3, or 4) of substrate holders. In an embodiment, there is provided an apparatus that includes a plurality (e.g. 2, 3, or 4) of imprint templates or imprint template holders. In an embodiment, there is provided an apparatus configured to use one template holder per substrate holder. In an embodiment, there is provided an apparatus configured to use more than one template holder per substrate holder. In an embodiment, there is provided an apparatus that includes a plurality (e.g. 2, 3, or 4) of imprintable medium dispensers. In an embodiment, there is provided an apparatus configured to use one imprintable medium dispenser per substrate holder. In an embodiment, there is provided an apparatus configured to use one imprintable medium dispenser per imprint template holder. In an embodiment, where an apparatus is provided that includes a plurality of substrate holders, the substrate holders may share functionalities in the apparatus. For instance, the substrate holders may share a substrate handler, a substrate cassette, a gas supply system (e.g. to create a helium environment during imprinting), an imprintable medium dispenser, and/or a radiation source (for curing the imprintable medium). In an embodiment, two or more of the substrate holders (e.g. 3 or 4) share one or more functionalities of the apparatus (e.g. 1, 2, 3, 4, or 5 functionalities). In an embodiment, one or more functionalities (e.g. 1, 2, 3, 4, or 5) of the apparatus are shared among all substrate holders.

The descriptions above are intended to be illustrative, not limiting. Thus, it will be apparent to those skilled in the art that modifications may be made to the invention as described without departing from the scope of the claims set out below.

The invention claimed is:

1. A method of obtaining alignment of a substrate and an imprint template, the method comprising:
   illuminating a first grating of an imprint template alignment grating with alignment radiation, the first grating comprising a first periodic arrangement of lines, each first grating line comprising a second grating having a second periodic arrangement of lines with a higher resolution than the first periodic arrangement of lines of the first grating;
   detecting alignment radiation redirected by the first grating;
   causing relative movement between the imprint template alignment grating and a substrate alignment grating to bring the imprint template alignment grating and the substrate alignment grating into coarse alignment based on the detected alignment radiation redirected by the first grating;
   subsequent to the coarse alignment, illuminating the second gratings of the imprint template alignment grating with alignment radiation;
   detecting alignment radiation redirected by the second gratings; and
   causing relative movement between the imprint template and the substrate to bring the imprint template alignment grating and the substrate alignment grating into fine alignment based on the detected alignment radiation redirected by the second gratings.

2. The method of claim 1, wherein the first periodic arrangement of the first grating comprises four or more spaced-apart essentially identical lines.

3. The method of claim 1, wherein the lines of the second gratings extend in substantially the same direction as the lines of the first grating.

4. The method of claim 1, wherein the lines of the second gratings extend in a direction which is substantially transverse to the direction of the lines of the first grating.

5. The method of claim 1, wherein the illuminating the first grating, the detecting alignment radiation redirected by the first grating, and the causing relative movement between the imprint template alignment grating and the substrate alignment grating to bring the imprint template alignment grating and the substrate alignment grating into coarse alignment comprises:
   causing relative movement between the imprint template alignment grating and the substrate alignment grating in a first lateral direction;
   causing a modulation movement between the imprint template alignment grating and the substrate alignment grating in a second lateral direction, which includes a component that is perpendicular to the first lateral direction, during the relative movement;
   illuminating the imprint template alignment grating with the alignment radiation during the relative movement and the modulation movement;
   detecting alignment radiation redirected by the imprint template alignment grating;
   determining a modulation of the detected alignment radiation when the substrate alignment grating and the imprint template alignment grating overlap; and
   determine a maximum overlap between the substrate alignment grating and the imprint template alignment grating based on the determined modulation, the maximum overlap providing alignment of the substrate and the imprint template.

6. The method of claim 5, wherein:
   the imprint template alignment grating has a known separation in the first lateral direction from a further imprint template alignment grating, and
   the substrate alignment grating has a known separation in the first lateral direction from a further substrate alignment grating; and
   the method further comprises determining an aligned position of the further imprint template alignment grating and the further substrate alignment grating based upon the relative positions of the substrate and the imprint template when the maximum overlap occurred.

7. The method of claim 5, wherein an amplitude of the modulation movement in the second lateral direction is smaller than a pitch of the imprint template and substrate alignment gratings.

8. The method of claim 7, wherein the amplitude of the modulation movement in the second lateral direction is less than or equal to half of the pitch of the imprint template and substrate alignment gratings.

9. The method of claim 5, wherein the method is repeated in a substantially perpendicular lateral direction.

10. An imprint lithography apparatus comprising:
an imprint template holder configured to hold an imprint template;
an alignment radiation outlet;
a detector;
a hardware processor; and
a non-transitory computer-readable medium containing one or more machine-readable instructions that when executed by the hardware processor:
cause illumination of a first grating of an imprint template alignment grating with alignment radiation, the first grating comprising a first periodic arrangement of lines, each first grating line comprising a second grating having a second periodic arrangement of lines with a higher resolution than the first periodic arrangement of lines of the first grating;
cause detection of alignment radiation redirected by the first grating;
cause relative movement between the imprint template alignment grating and a substrate alignment grating to bring the imprint template alignment grating and the substrate alignment grating into coarse alignment based on the detected alignment radiation redirected by the first grating;
subsequent to the coarse alignment, cause illumination of the second gratings of the imprint template alignment grating with alignment radiation;
cause detection of alignment radiation redirected by the second gratings; and
cause relative movement between the imprint template and the substrate to bring the imprint template alignment grating and the substrate alignment grating into fine alignment based on the detected alignment radiation redirected by the second gratings.

11. The apparatus of claim 10, wherein the first periodic arrangement of the first grating comprises four or more spaced-apart essentially identical lines.

12. The apparatus of claim 10, wherein the lines of the second gratings extend in substantially the same direction as the lines of the first grating.

13. The apparatus of claim 10, wherein the lines of the second gratings extend in a direction which is substantially transverse to the direction of the lines of the first grating.

14. The apparatus of claim 10, wherein the instructions configured to cause illumination of the first grating, cause the detection of alignment radiation redirected by the first grating, and cause relative movement between the imprint template alignment grating and the substrate alignment grating to bring the imprint template alignment grating and the substrate alignment grating into coarse alignment are further configured to:
cause relative movement between the imprint template alignment grating and the substrate alignment grating in a first lateral direction;
cause a modulation movement between the imprint template alignment grating and the substrate alignment grating in a second lateral direction, which includes a component that is perpendicular to the first lateral direction, during the relative movement;
cause illumination of the imprint template alignment grating with the alignment radiation during the relative movement and the modulation movement;
cause detection of alignment radiation redirected by the imprint template alignment grating;
determine a modulation of the detected alignment radiation when the substrate alignment grating and the imprint template alignment grating overlap; and
determine a maximum overlap between the substrate alignment grating and the imprint template alignment grating based on the determined modulation, the maximum overlap providing alignment of the substrate and the imprint template.

15. The apparatus of claim 14, wherein:
the imprint template alignment grating has a known separation in the first lateral direction from a further imprint template alignment grating, and
the substrate alignment grating has a known separation in the first lateral direction from a further substrate alignment grating; and
the instructions are further configured to determine an aligned position of the further imprint template alignment grating and the further substrate alignment grating based upon the relative positions of the substrate and the imprint template when the maximum overlap occurred.

16. The apparatus of claim 14, wherein an amplitude of the modulation movement in the second lateral direction is smaller than a pitch of the imprint template and substrate alignment gratings.

17. The apparatus of claim 16, wherein the amplitude of the modulation movement in the second lateral direction is less than or equal to half of the pitch of the imprint template and substrate alignment gratings.

18. An imprint template alignment grating comprising a first grating comprising a first periodic arrangement of four or more spaced-apart essentially identical lines resolvable for measurement by an alignment measuring system, wherein each line of the four or more spaced-apart essentially identical lines comprises a second grating, each second grating comprising a second periodic arrangement of lines with a higher resolution than the first periodic arrangement of lines of the first grating and the second periodic arrangement of lines also being resolvable for measurement by the alignment measuring system.

19. The imprint template alignment grating of claim 18, wherein the lines of the second periodic arrangements of lines of the second gratings extend in substantially the same direction as do the four or more spaced-apart essentially identical lines of the first periodic arrangement of the first grating.

20. The imprint template alignment grating of claim 18, wherein the lines of the second periodic arrangements of lines of the second gratings extend in a direction which is substantially transverse to a direction in which the four or more spaced-apart essentially identical lines of the first periodic arrangement of the first grating extend.

* * * * *